United States Patent [19]
Loeffler et al.

[11] Patent Number: 4,520,315
[45] Date of Patent: May 28, 1985

[54] NUCLEAR SPIN TOMOGRAPHY METHOD

[75] Inventors: Wilfried Loeffler, Herzogenaurach; Arnulf Oppelt, Buckenhof; Horst Siebold, Erlangen, all of Fed. Rep. of Germany

[73] Assignee: Siemens Aktiengesellschaft, Berlin & Munich, Fed. Rep. of Germany

[21] Appl. No.: 413,962

[22] Filed: Sep. 1, 1982

[30] Foreign Application Priority Data

Sep. 7, 1981 [DE] Fed. Rep. of Germany ....... 3135335

[51] Int. Cl.³ ........................................... G01R 33/08
[52] U.S. Cl. .................................... 324/309; 324/307
[58] Field of Search ............... 324/300, 303, 307, 309, 324/312

[56] References Cited

U.S. PATENT DOCUMENTS 4,300,096 11/1981 Harrison .............................. 324/309
4,431,968 2/1984 Edelstein ............................. 324/309

Primary Examiner—Michael J. Tokar
Attorney, Agent, or Firm—Hill, Van Santen, Steadman & Simpson

[57] ABSTRACT

A disclosed exemplary method provides complete mensuration of all two-dimensional Fourier components of a nuclear spin property and image reconstruction. In spite of unavoidable inhomogeneities of the DC magnetic field, an optimum sectional image is to be obtained. To this end, the exemplary method provides an optimally brief pulse train in that first, by means of a 90°-Hf-pulse with a switched-on z-gradient a z=constant layer is excited, after termination of which an x-gradient and simultaneously a y-gradient are switched on. Following this is a 180°-Hf-pulse which is followed by a z- and simultaneously a y-gradient, so that the difference between the y-gradient effect before the 180°-Hf-pulse and thereafter can be varied. Then follows that particular x-gradient during which the nuclear spin echo is measured (whose symmetry center arises at a fixed time). For a N×N-image (N=number of the image points e.g. 128 in one line), measurements are taken for N such operating cycles with respectively varying differences of the y-gradient effects. The disclosed method is particularly capable of implementation in medical diagnostics (Zeugmatography).

18 Claims, 16 Drawing Figures

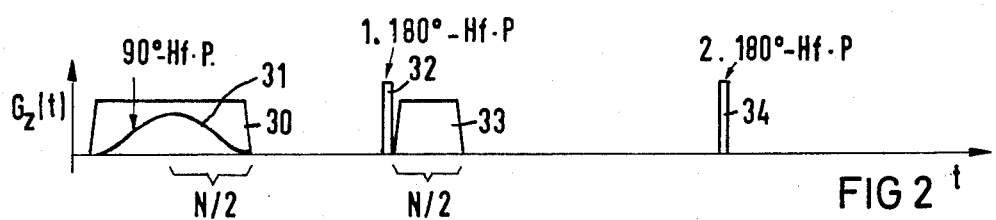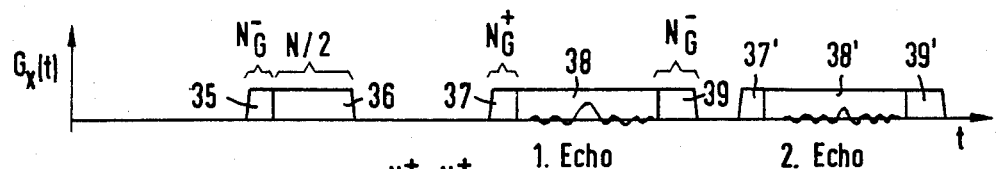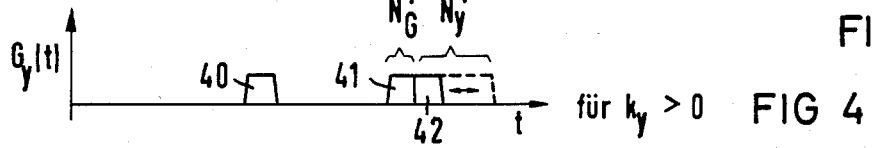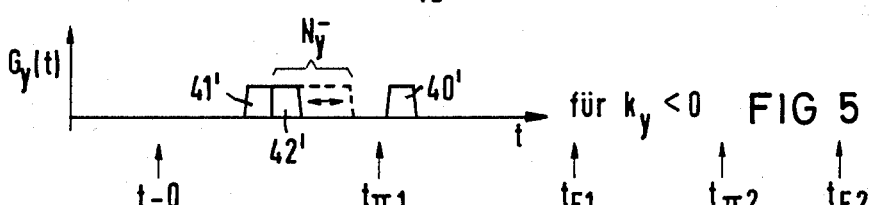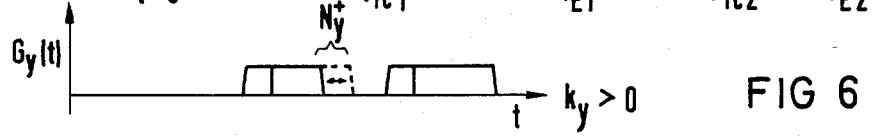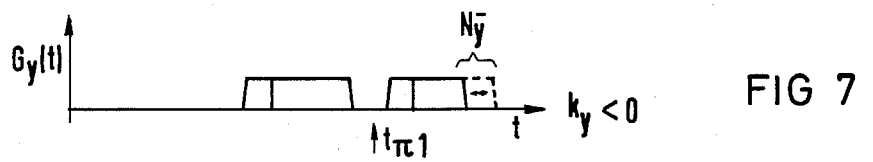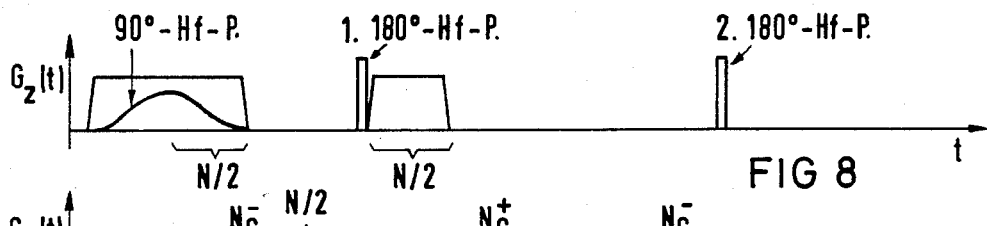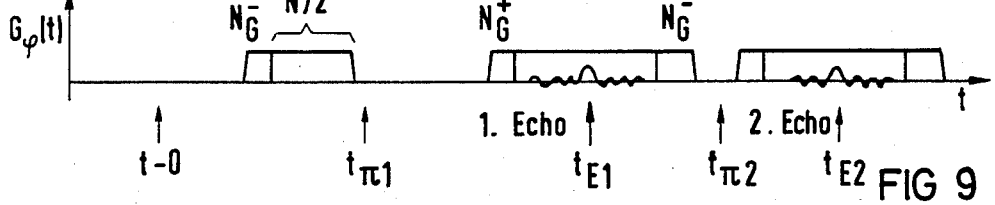

NUCLEAR SPIN TOMOGRAPHY METHOD

BACKGROUND OF THE INVENTION

The invention relates to a nuclear spin tomography method according to the preamble of patent claim 1. Such a method is described e.g. in U.S. Pat. No. 4,070,611.

Methods which permit the image-representation of the interior of bodies from the exterior pursuant to application of nuclear magnetic resonance effects have also become known under designations such as Zeugmatography, Spin-Imaging, Spin-Mapping or FONAR. With the aid of such methods it is possible to image the density of specific isotopes as well as the distribution of the nuclear magnetic relaxation times over a body cross-section. For medical diagnostics, the hydrogen bound to water is of particular importance. One can thus obtain, in a non-invasive manner, data regarding the physical and chemical state of living tissue. As the measuring basis for this purpose the known phenomena of nuclear magnetic resonance are employed.

In carrying out diagnostic methods of the present type, the body to be examined is exposed to a DC magnetic field $B_o$ and the nuclear isotopes to be be detected are excited to precession by means of a high frequency field $B_1$. $B_1$ must here have the frequency $\omega = \gamma \cdot B_o$ given by the gyromagnetic ratio. The allocation of the nuclear resonance signal—detectable in a receiver coil as a consequence of the precession movement—to the location of its origin proceeds through the application of linear magnetic field gradients, such as are described e.g. by P. C. Lauterbur in "Nature" 242 (1973), pages 190/191. If $G_x$ is the intensity of the field gradient in the x-direction, the local nuclear resonance frequency $\omega$ (x) results at:

$$\omega(x) = \gamma(B_o + G_x \cdot x).$$

It is thus possible to allocate the nuclear resonance signal, on the basis of its frequency, to a specific location along the x-direction. Though successive application of linear field gradients $G_x$, $G_y$, and $G_z$, in all three spatial directions x, y, z, also a three-dimensional localizing in an extended subject is possible.

A simple implementation of the method disclosed in the above-captioned U.S. Pat. No. 4,070,611 presents difficulties, since a very brief rise time of the gradient current pulses is required, on the one hand, and each virtually unavoidable basic field inhomogeneity leads to a reduction of the signal, on the other hand. The method described in the present invention is not, or only insignificantly, influenced by these two difficulties.

SUMMARY OF THE INVENTION

Accordingly, the invention has the objective, in the case of a method according to the preamble of claim 1, with a given technically unavoidable inhomogeneity of the DC magnetic field, of producing a sectional image of a body which is optimum with regard to signal-to-noise ratio and freedom from artifacts.

This objective is achieved in accordance with the invention by virtue of the fact that an optimally brief pulse train is employed, in that first, with a switched-on Z-gradient, by means of a shaped 90°-Hf-pulse, a layer at a specific position along the Z axis (z=const) is excited, that following termination of the Hf-irradiation of the period (or duration) $T_z$, an x-gradient of the period $T_x/2$ ($T_x$ e.g. 10 ms) and simultaneously a y-gradient ($G_y$) with variable length are switched-on, whereupon, at the constant time $T_{\pi 1}$, a 180°-Hf-pulse follows, which is followed simultaneously by a z-gradient of the length $T_z/2$ ($T_z$ e.g. 10 ms) and a y-gradient of variable length, so that the difference between the y-gradient effect $\int G_y(t)dt$ before the 180°-Hf-pulse and the y-gradient effect subsequent thereto varies from $(-N/2)$-times to $(N/2-1)$-times an increment $T_x G_x \cdot 1/N$, whereupon that particular x-gradient of the period $T_x$ follows, during which time the entire nuclear spin echo is being measured, which arises at the fixed time $t_{E1}$ as symmetry center, and that, for an N×N-image (N=number of image points), N of such operating sequences (or cycles) are measured, whereby the y-gradient effect varies in the above-cited fashion.

In the following further explanations of details and advantages of the invention, reference is made to known terms from nuclear magnetic resonance pulse spectroscopy; for example, 90°- and 180°-pulse, and to the exemplary embodiments illustrated in the Figures on the accompanying drawing sheets; and other objects, features and advantages will be apparent from this detailed disclosure and from the appended claims.

BRIEF DESCRIPTION OF THE DRAWING

In FIG. 2 there is illustrated, in a diagram plotting the z-gradient signals $G_z(t)$ as a function of time, the sequence of the Hf- and z-gradient pulses, of a favorable pulse train;

In FIG. 3 there is illustrated the corresponding sequence of the x-gradient pulses, $G_x(t)$;

In FIG. 4 there is illustrated the corresponding sequence of y-gradient pulses for positive gradient effects $k_y$;

In FIG. 5 there is illustrated the corresponding sequence of the y-gradient pulses for negative gradient effects $k_y$;

In FIGS. 6 and 7, in a diagram, alternative switching sequences for the y-gradient are illustrated, whereby the latter is switched-on as long as possible;

In FIGS. 8 and 9, there are illustrated, in diagrams, the pulse trains for projection-reconstruction-methods, In FIG. 10 a variant for the y-gradient coil is illustrated, In FIGS. 11 and 12, an alternative pulse train is illustrated in a diagram for which the current supply of the y-gradient must be designed in a bipolar fashion, and In FIGS. 13a–13d an example is illustrated of the excitation diagram for the purpose of simultaneous measurement of several layers.

DETAILED DESCRIPTION

Figure 1:
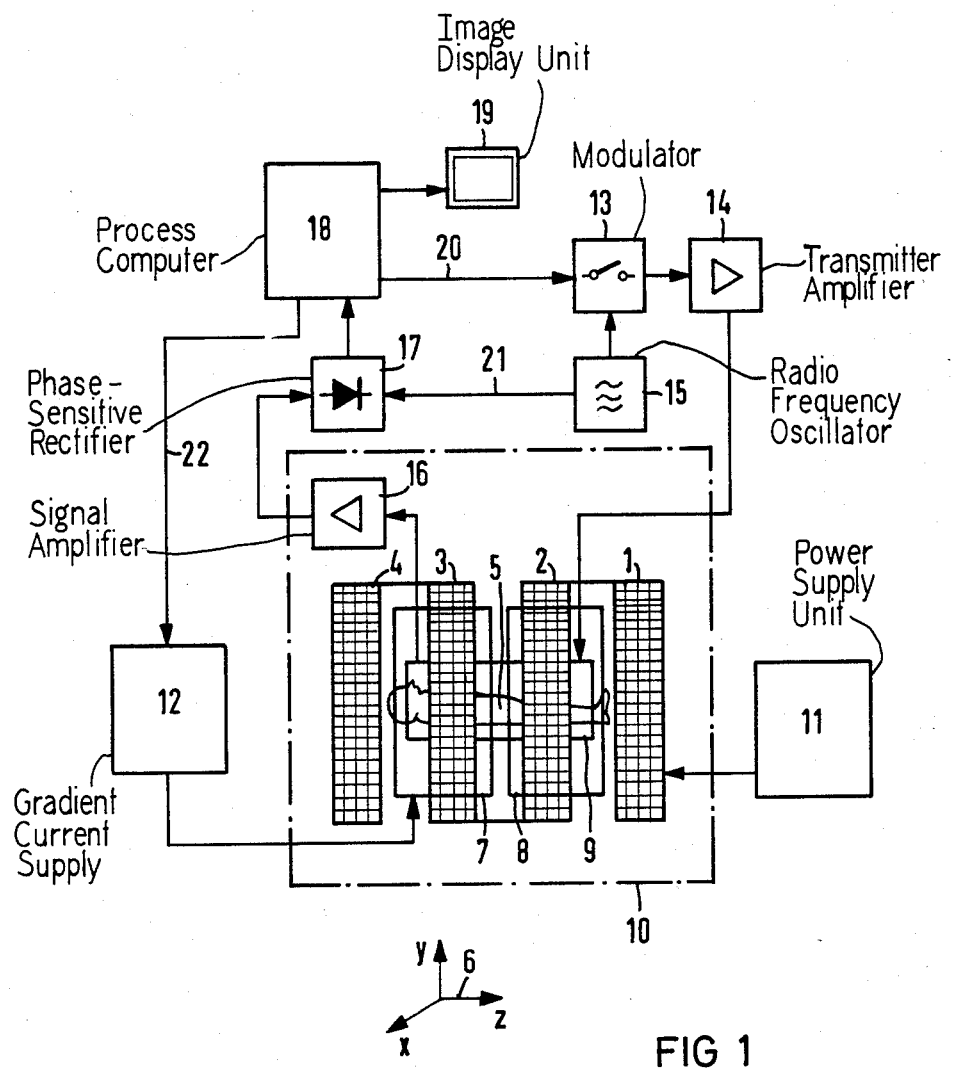
In FIG. 1 the block circuit diagram of an apparatus is schematically illustrated which is suitable for carrying out the inventive nuclear spin tomography method.

In FIG. 1, 1 and 2, as well as 3 and 4, characterize coils with which a DC magnetic field $B_o$ is generated in which, in the case of application for medical diagnostics, the body 5, to be examined of a patient is disposed. Moreover, gradient coils are associated with said patient which are provided for the purpose of generating independent, mutually perpendicular magnetic field gradients of the directions x, y, and z, according to the directions indicated at 6 in FIG. 1. In the Figure, for the purpose of clarity, only coils 7 and 8 are illustrated which, together with a pair of opposite similar coils, serve the purpose of generating an x-gradient. The similar, not-illustrated y-gradient coils are disposed parallel to the body 5 and above as well as below said body and those for the z-gradient field are disposed transversely to the longitudinal axis at the head end and at the foot end. The arrangement, moreover, additionally contains a high frequency coil 9 serving the purpose of excitation of the nuclear resonance and reception of the nuclear resonance signals.

The coils 1 through 4, 7, 8 and 9, bordered by a dash-dot line 10, represent the actual examination instrument. It is operated from an electric arrangement which comprises a power supply unit 11 for the operation of the magnetic coils 1 through 4, as well as a gradient current supply 12 to which the coils 7 and 8, as well as the additional gradient coils, are connected. The coil 9, serving the purpose of excitation as well as reception of the signal, is connected, via a modulator 13 and a transmitter amplifier 14, to a radio-frequency oscillator 15, on the one hand, and, via a signal amplifier 16 and a phase-sensitive rectifier 17, to a process computer 18, on the other hand, from which, for the purpose of output of the image information, a viewing screen apparatus 19 is supplied. For controlling the arrangement, moreover, additionally connections 20, 21, and 22, are provided between the computer 18 and the modulator 13, between the oscillator 15 and the rectifier 17, as well as between the computer 18 and the gradient current supply 12.

Subsequently, following switching-on of the basic field with the aid of the gradient current supply and the Hf-transmitting- and receiving-system, for example the sequence sketched in FIG. 2, is executed. First, the excitation of a layer with z=const takes place by means of a selective 90°-Hf-pulse. To this end, the z-gradient of a corresponding time function 30 is switched-on. Simultaneously, a Hf-pulse with an envelope as indicated at 31 is radiated-in. The frequency of the Hf-pulse conforms, according to $\omega(z)=\gamma(B_o+G_z\cdot z)$, to the position z of the layer to be excited. The duration of the pulse amounts to N times a basic time raster $\Delta t$ which is adjusted depending upon the intensity of the gradients and the thickness of the desired layer and which lies on the order of magnitude of 100 μs. N is, for example, 128. Gradient current pulses $G_x$ follow with a length of $(N_G^- + N/2)\cdot\Delta t$, designated by 35 and 36, whereby the number $N_G^-$, must be so selected that, after the time $N_G^-\cdot\Delta t$, the gradient current has reached its constant value after the rising edge. Simultaneously the y-gradient for a time $N_G^-\cdot\Delta t$, referenced here with 40, is switched on. After a 180°-Hf-pulse 32, the z-gradient for $N/2\cdot\Delta t$, referenced with 33, FIG. 2, may be switched on. Simultaneously the y-gradient for a time of $(N_G^+ + N_y^+)\cdot\Delta t$ is switched on (41,42, FIG. 4), whereby, for $N_y^+ = N/2-1$, the difference of the effects of the y-gradient prior to and after the 180° pulse, as desired, in the first scan is equal to $G_y\cdot\Delta t\cdot(N/2-1)$. It is assumed that the gradient effect during the time $N_G^-\cdot\Delta t$ (40, FIG. 4) prior to the 180°-pulse (32, FIG. 2) is equal to the gradient effect during the time $N_G^+\cdot\Delta t$ (41, FIG. 4) after the 180°-pulse. During the following x-gradient pulse of the period $(N_G^+ + N + N_G^-)\cdot\Delta t$ with the references 37, 38, 39, FIG. 3, an echo of the nuclear resonance signal results which is scanned via the high frequency electronics and output. It is additionally possible, with the aid of an additional 180°-pulse 34, FIG. 2, and an x-gradient pulse 37', 38', 39', FIG. 3, to generate and evaluate an additional echo which corresponds to the Fourier spectrum of the examined layer for an inverted wave count vector in y-direction $(-k_y)$. In further scans the experiments (examination sequences) are then analogously repeated, whereby the period of the y-gradient pulse 42, FIG. 4, is reduced to zero step-by-step and, in the then following scans, the y-gradient pulse 40', FIG. 5, after the 180°-pulse 32, FIG. 2, constantly maintains the length $N_G^+\cdot\Delta t$, whereas the y-gradient pulse 42, FIG. 5, prior to the 180°-pulse is extended from zero in step-by-step fashion to $N/2\cdot\Delta t$. When a complete data set for all desired lengths of the y-gradient pulses is present, then the data is subjected in the process computer to a two-dimensional Fourier-transformation, whereupon the image which has thus resulted is transmitted to the viewing screen apparatus 19.

The limitation to only one layer keeps the overall measuring time for an image brief, which is important for medical application. Moreover, the demands made of the dynamic (or contrast) range of the pre-amplifier 16 and the analog-to-digital converter, which are considered in FIG. 1 as part of the process computer, are smaller than in the case of methods which simultaneously utilize the signal from the entire volume range.

As proposed by A. Kumar, D. Welti, and R. R. Ernst (J. Magn. Res. 18 (1975) 69), the distribution of a nuclear resonance parameter can be calculated as a function of the location (x,y) by means of two-dimensional Fourier transformation from measured signal values $S(t,N_y)$, if said signal values represent the Fourier coefficients $S(k_x,k_y)$ of this distribution. The variables $k_x$ and $k_y$ describe the wave numbers of the respective direction and are given by $$k_x(t) = \gamma \int_0^t G_x(t')dt'$$

$$k_y(t) = \gamma \int_0^t G_y(t')dt'$$

If one describes the phase position of the transverse magnetization-generated by the 90°-Hf-pulse-of a volume element at the location (x,y) by a complex number in the reference system rotating with $\gamma\cdot B_o$, then measurement is to be conducted as follows:

$$S(k_x, k_y) \sim \exp(i\,k_x\cdot x)\exp(i\,k_y\cdot y)$$

The measurement of the complex signal $S(k_x, k_y)$ proceeds in terms of apparatus through phase-sensitive rectification with the transmitter oscillator as reference. In order to obtain a real $N\times N$-image with good sharpness and good contrast, a value supply as follows suffices:

$$k_x = (-N/2)\cdot\Delta k_x - (N/2-1)\cdot\Delta k_x$$

$$k_y = (-N/2)\cdot\Delta k_y - 0.$$

One would have to take the real part of the complex two-dimensional-Fourier-transformed signal, the "absorption", as image value, and one would have to reject the imaginary component, the "dispersion", since the latter, on account of its broad wings, is not suitable for the imaging.

However, in practice, there is added to the above ideal signal an additional unknown phase factor which originates from basic field-inhomogeneities and -drifts and from non-perfect electronics adjustment. In the computer processing this effects a dispersive admixture to the real image value, and hence a quality deterioration.

It is therefore better to measure, also for $k_y$, a complete value supply; i.e., double as many pulse trains $$k_y = (-N/2) \cdot \Delta k_y - (N/2-1) \cdot \Delta k_y,$$

which is often in practice necessary anyway for the obtainment of a usable signal-to-noise ratio. The double Fourier transformation thus yields a complex image value with imaginary part equal to zero in the ideal instance; i.e., an absolute sum-resolved locally in a sharp and high-contrast manner-of the complex image value, in case the above-cited interferences cause a phase rotation or a phase shift as a function of frequency over the image plane.

The pulse train employed according to FIG. 2 permits the generation of the entire value range of the wave numbers $k_x$, $k_y$ (thus also the negative ones) with only *one* polarity of the gradient fields. The electronics for the rapid switching of the gradient fields is very costly and would have to be separately installed per se for each polarity in case the polarity would have to be changed within a pulse train for the purpose of mensuration of positive and negative $k_x$- and $k_y$-components.

We shall now consider the generation of the desired $k_x$ and $K_y$-values by means of the proposed pulse train in FIG. 3. The x-gradient pulse 35, 36, before the 180°-Hf-pulse, with the period $(N_G^- + N/2) \cdot \Delta t$, whereby $\Delta t$ is a fixed time raster, produces a magnetization $M_{xy}^- \sim \exp(i k_x^- \cdot x)$, with $k_x^- = (N_G^- + N/2) \cdot \Delta t \cdot \gamma G_x$ where $G_x$ is the intensity of the x-gradient field. The first y-gradient pulse 40, or 42' (FIG. 5) respectively, additionally generates a phase/frequency characteristic in the y-direction:

$$M_{xy}^- \sim \exp(i k_x^- \cdot x + i k_y^- \cdot y), \text{ with}$$

$$k_y^- = N_G^- \Delta t \cdot \gamma G_y \text{ for } k_y > 0$$

$$k_y^- = (N_G^- + N_y^-) \Delta t \gamma G_y \text{ for } k_y \leq 0$$

in the first variant (FIGS. 4, 5). The subsequent 180°-Hf-pulse 32 reverses, no matter what phase it has, the signs of the phases in the $M_{xy}$-magnetization.

$$M_{xy}^+ \sim \exp(-i k_x^- \cdot x - i k_y^- \cdot y)$$

The y-gradient is switched on for the second time and delivers, at the end of the pulse 42, or 40', respectively, the desired wave number $k_y$ for $N_G^- = N_G^+$:

$$k_y(N_y^+) = \gamma G_y[-N_G^- + (N_G^+ + N_y^+)]\Delta t = \gamma G_y N_y^+ \cdot \Delta t > 0$$

$$k_y(N_y^-) = \gamma G_y[-(N_G^- + N_y^-) + N_G^+]\Delta t = -\gamma G_y N_y^- \Delta t \leq 0$$

The additionally introduced intervals $N_G^+$ and $N_G^-$ 41 and 41' avoid the necessity of extremely brief pulses of the length $1 \cdot \Delta t$, $2 \cdot \Delta t$, etc., being switched; it is then, namely, technically difficult to exactly obtain the desired pulse effect $\int G_y(t)dt = G_y \cdot n \cdot \Delta t$, since, in the case of brief time intervals, the gradient current is again already switched off before current and field have attained their stationary value. The additional intervals in the y-gradient pulse thus ensure the linearity of the progression (or course) of the wave number $k_y$ as a function of the variable clock pulse number $N_y$.

The second x-gradient commences with a time interval $N_G^+ \cdot \Delta t$, referenced with 37 in FIG. 3, while the gradient field stabilizes itself and the preamplifier at the receiver coil recovers from the 180°-Hf-pulse and the switching edge of the x-gradient. In the case of brief drop-off edges of the gradient pulses, $N_G^+ = N_G^-$; otherwise, $N_G^+$ can be selected a few clock pulses $\Delta t$ longer than $N_G^-$ in order to compensate for the contribution of the drop-off edge of the prior x-gradient-forward pulse; instead, the scanning of the measured values can also be displaced (or shifted) by a corresponding time delay.

If the first measured value at commencement of the interval 38 is received, the magnetization has the form: $M_{xy} \sim \exp[i \gamma G_y N_y \cdot \Delta t \cdot y]$.

$$\exp[i\gamma G_x(-N_G^- - N/2 + N_G^+)\Delta t \cdot x]$$

and hence also the signal has the previously demanded form (or shape)

$$S(k_x, k_y) \sim \exp[i k_x x] \cdot \exp[i k_y y]$$

with the desired value range for $k_x$, $k_y$. For $k_x = 0$; i.e., at the time $t = t_{E1}$, all volume elements relating to x are without phase shift, so that a signal maximum, a "nuclear spin echo" results.

The z-gradient 33 after the 180°-Hf-pulse 32 serves the purpose of minimizing the phase shift over the layer thickness $\Delta z$ in order to thus generate an echo which is as strong as possible. In the case of symmetric 90°-Hf-pulses, this is accomplished by a negative z-gradient, or, as in our case, by a positive z-gradient after a 180°-Hf-pulse, which is approximately half as long as the 90°-Hf-pulse 31 (equal z-gradient field intensity assumed).

The utilization of a central 180°-Hf-pulse for the generation of the signal has, in addition to the monopolar gradients, yet a further, very important advantage. At the time $t_{E1}$ of the echo the phase error, through a basic field inhomogeneity $\Delta B_o$, which added up to $\gamma \cdot \Delta B_o \cdot t_{E1}/2$ before the 180°-Hf-pulse, has again become zero; likewise, the phase shift within a volume element, due to $\partial \Delta B_o/\partial x$, $\partial \Delta B_o/\partial y$, $\partial \Delta B_o/\partial z$, at this time is zero. The signal is thus measured with the lowest-possible phase errors, and therefore also with an intensity hardly impaired by the basic field inhomogeneity. The signal is attenuated only by the unavoidable phase shift which originates from the intended (or desired) gradient fields $G_x$ and $G_y$.

Through the—if possible—simultaneous influence of the gradient fields $G_x$ and $G_y$ it has been successful in accordance with the invention to keep the pulse train until the echo, very brief. The signal is altogether essentially determined by the genuine transverse relaxation time $T_2$ of the observed nuclei in their material surrounding:

$$S(k_x, k_y) \sim \exp(-t_{E1}/T_2) \cdot \exp(i k_x \cdot x + i k_y \cdot y)$$

Since, with each pulse train, the measured values are detected at the same time following excitation, all $k_y$-Fourier components in the signal are also equally weighted.

Through an additional 180°-Hf-pulse 34, FIG. 2, according to the above-described measuring operation, a second echo can be generated. Directly following this second 180°-pulse, the magnetization has the form:

$$M_{xy}(t > t_{\pi 2}) \sim \exp[-i\, k_y \cdot y - i\gamma G_x(N/2 + N_G^-)\Delta t \cdot x]$$

Symmetrically to the second 180°-Hf-pulse the x-gradient is again switched on corresponding to the first readout interval (37', 38', 39'). Whereas the wave numbers $k_x$ again run from $\gamma G_x \cdot (-N/2) \cdot \Delta t$ to $\gamma G_x \cdot (N/2-1) \cdot \Delta t$, as in the case of the first echo, the wave vector $k_y$ is now inverted, which must be taken into consideration in the computational processing. Thus, in the second echo the following results:

$$S_2(k_x, k_y) \sim \exp(-t_{E2}/T_2) \cdot (i\, k_x x - i\, k_y Y) = \exp-(t_{E2} - t_E)/T_2 \cdot S(k_x, -k_y)$$

In the same manner, also additional echoes can then be generated, whereby the odd-numbered and the even-numbered echoes respectively comprise the same information.

In the case of Hf-pulses it is advisable, as is known, to change the sign from pulse to pulse in order that effects of small Hf field intensity deviations from the nominal value cannot be added up.

Since, in the generation of the wave number $k_y$, only the difference between the y-gradient-pulse lengths before and after the first 180°-Hf-pulse is decisive, further variants for this are conceivable. A second variant is illustrated in FIGS. 6, 7. Whereas, in the first variant, the y-gradients, at least $N_G$, but otherwise as briefly as possible, are connected, in the case of the second variant, they are connected as long as possible; this is advantageous if the building-up time of the y-gradient field is very long. For positive $k_y$-values the switching-on interval before the 180°-pulse varies from $N_G^- \cdot \Delta t$ to $(N_G^- + N/2 - 1) \cdot \Delta t$, given a constant switching-on time of $(N_G^+ + N/2) \cdot \Delta t$ after the 180°-pulse. Conversely, for negative $k_y$-values, the switching-on period after the 180°-pulse is altered from $(N_G^+ + N/2 - 1) \cdot \Delta t$ to $N_G^+ \cdot \Delta t$, whereas previously the switching-on time amounts constantly to $(N_G^- + N/2) \cdot \Delta t$.

Figure 10:
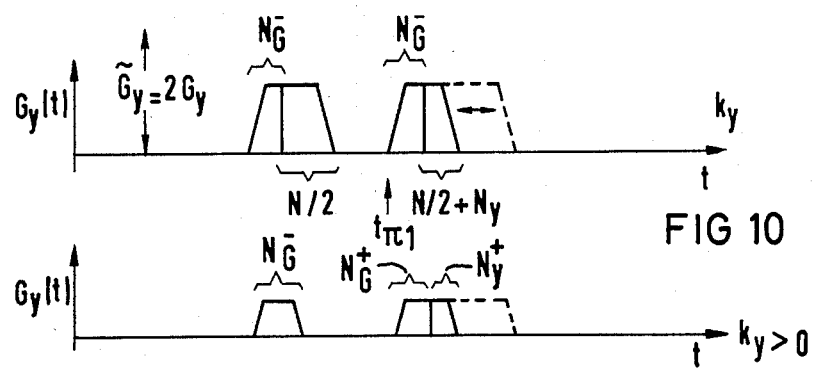

In FIG. 10 the third variant of a possible circuit diagram for the y-gradient coil is illustrated which can be employed instead of the variant 1 of FIGS. 4 and 5. Positive as well as negative wave numbers $k_y$ are attained through sole variation of the second y-gradient, whereas the first y-gradient before the 180°-Hf-pulse exhibits constant length. In order to realize a total of N length gradiations, e.g. the time steps $\widetilde{\Delta t} = \Delta t/2$ are selected half as long as in the case of variant 1; as compensation the amplitude $\widetilde{G}_y$ of the y-gradient field must then be doubled: $\widetilde{G}_y = 2 \cdot G_y$, and in general, $\widetilde{G}_y = 2 \cdot G_x$. However, it is also possible to operate with an unaltered time raster and unaltered gradient intensity. Only then, the 180°-Hf-pulse must be delayed by an interval $N/2 \cdot \Delta t$, and the readout interval delayed by $N \cdot \Delta t$ relative to the previous timing in order to still fully utilize all advantages of the spin echo method. The stepwise changing of the duration of the y-gradient solely after the 180°-Hf-pulse is more favorable if the Hf field is inhomogeneous.

Figure 11:
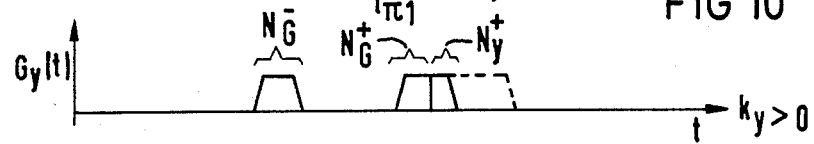
Figure 12:
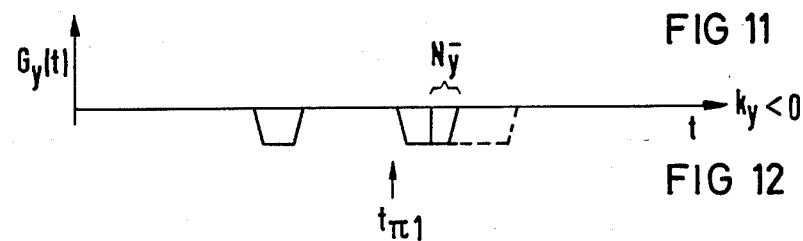
Figure 13A:
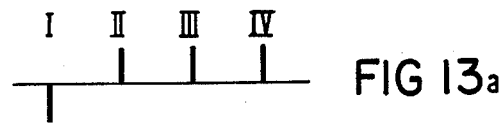
Figure 13B:
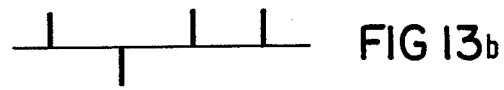
Figure 13C:
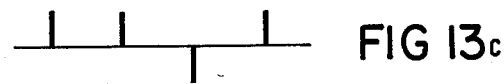
Figure 13D:

The doubling of the field amplitude of the y-gradient can also be avoided if its current supply is designed in bipolar fashion, such as is illustrated in variant 4 in FIGS. 11 and 12. Through the additional intervals $N_G^-$ and $N_G^+$ the precise preparation of the small $k_y$ values is unproblematical. Naturally precaution must be exercised to ensure that the amount of the negative gradient current is equal to that of the positive.

A pulse train for the production of a tomographic (or layer) image according to the projection-reconstruction method is illustrated in FIGS. 8, 9. It results from the pulse train according to FIG. 2 for the 2D-Fourier method essentially through the omission of the y-gradient pulses. Instead of the x-gradient field, a gradient field of equal intensity, but variable direction $\phi$ is generated, whereby the angle $\phi$ covers the x-y-plane and, with each operating cycle, is increased by an amount $\Delta\phi$. In case the rotation of the $\phi$-gradient field occurs through mechanical rotation of the coil arrangement, a monopolar current supply suffices. In the case of two coil arrangements orthogonal to one another, the one amplitude $G_x$ must vary from cycle to cycle with $\cos\phi$, the other $G_y$ with $\sin\phi$. If $\phi$ covers the angular range of 0 through 180°, then the current supply of the x-gradient coil must be designed in bipolar fashion.

All advantages otherwise illustrated in the case of the 2D-Fourier method according to FIG. 2, which do not relate to the y-gradient, apply also to the application in the case of the projection-reconstruction-method. They are here listed only in the key-word fashion, since they have already been described therein: selective excitation of a $z_o$-const layer including refocusing by a second, homopolarized z-gradient pulse.

Through the phase-sensitive mensuration of entire, symmetric echoes, the spectrum of the signal of an operating sequence (or cycle) is real under ideal conditions; in the case of interferences due to electronic phase errors and basic field-inhomogeneities, the sum of the complex spectrum can again be employed as real projection without deterioration of the imaging properties.

The additional intervals $N_G$ ensure the constancy of the gradient field intensity during the measured value detection. The signal intensity is, on account of the central 180°-Hf-pulse, hardly attenuated by basic field inhomogeneities; several echoes can be measured in one operating sequence (or cycle). All described imaging methods can be modified to the extent that, through the selective 90° pulse, several parallel layers are simultaneously excited. The sign, or differently expressed the phase position, of the excitation is then successively varied for the individual, excited layers within an otherwise equal measuring sequence in order, with the aid of suitable decoding algorithms, to be able to obtain the signal conributions of the individual layers from the overall signal. Since, in the case of N parallel, simultaneously excited layers, at least N measuring cycles with a different excitation sign for a decoding are necessary, one obtains no abbreviation of the overall measuring time in comparison with the successive measurement of the individual layers. However, one obtains a signal-to-noise ratio which is higher by the factor of $\sqrt{N}$.

FIG. 13 illustrates as an example a suitable excitation sequence for the simultaneous mensuration of four layers. If $S_a$–$S_d$ designate the aggregate signals obtained with these experiments, and $S_I$ to $S_{IV}$ designate the signals expected with excitation of each individual layer, then the following is valid:

$$-S_a + S_b + S_c + S_d = 4S_I$$

$$S_a - S_b + S_c + S_d = 4S_{II}$$

$$S_a + S_b - S_c + S_d = 4S_{III}$$

$S_a + S_b + S_c - S_d = 4S_{IV}$

Through application of the inventive excitation sequence one thus obtains, in four measurements, the signals of the four planes with a signal-to-noise ratio corresponding to an averaging over four measuring cycles. A generalization N simultaneously excited layers is readily possible corresponding to the method disclosed in the German OS 29 36 465 for N parallel lines in one plane.

It will be apparent that many modifications and variations may be made without departing from the scope of the teachings and concepts of the present invention.

Supplemental Discussion

With respect to the timing relationships in the various illustrative embodiments, the following may be noted:

(a) Scanning along successive lines of a selected layer is effected by the relative duration of an orthogonal field gradient (e.g. $G_y$) before and after the brief 180° high frequency pulse (e.g. 32, FIG. 2) in successive measurement cycles. The duration of the 90° high frequency pulse in the modifications of FIGS. 2–5, 6–7, 10 and 11–12 may be about ten milliseconds, e.g. N·Δt where N=128 and Δt=100 microseconds. The intervals between the center of the 90° pulse at t-0 and the brief 180° pulse at $t_{\pi 1}$ substantially corresponds to the interval between times $t_{\pi 1}$ and $t_{E1}$.

(b) The intervals between t-0, $t_{\pi 1}$ and $t_{E1}$ are relatively brief. For example, each interval may be of of the order 1.5N·Δt (e.g. fifteen milliseconds).

(c) The orthogonal field gradients (e.g. $G_x$ and $G_y$ for the variants of FIGS. 3–5, 6–7, 10 and 11–12) may be switched on simultaneously following termination of the high frequency irradiation, and occupy a maximum time interval which may be less than the duration of the 90° pulse. Thus the $G_x$ pulse 35,36 may be on continuously for a time interval of slightly more than N/2·Δt, e.g. slightly more than five milliseconds.

(d) Multiple 180° pulses may follow each other, e.g. at intervals of the order of 3N·Δt or about thirty milliseconds.

The following documents are incorporated herein by reference to way of background:

U.S. Pat. No. 4,070,611 dated Jan. 24, 1978 and U.S. Pat. No. 4,390,840 dated June 28, 1983.

We claim as our invention:

1. A nuclear spin tomography method comprising effecting a mensuration of all two-dimensional Fourier components of a desired nuclear spin density in a selected layer with the use of three gradient fields disposed in three mutually orthogonal directions x, y, z, and effecting an image reconstruction with respect to the desired nuclear spin property in said layer, characterized in that, employing an optimally brief pulse train, said mensuration is effected by the steps comprising:

(1) applying in conjunction with a first field gradient $G_z$ with respect to a first axis z a shaped 90° high frequency pulse 90°-Hf-P to excite a layer with a given location with respect to the first axis z=const for a 90° pulse time duration $T_z$, (2) following termination of the 90° high frequency pulse of said 90° pulse time duration $T_z$, applying orthogonally related second and third field gradients $G_x$ and $G_y$ with respect to second and third axes x and y, the second field gradient $G_x$ having a timing $T_{x/2}$ and $T_x$ related to the scanning of the layer relative to said second axis, and the third field gradient $G_y$ having a variable timing characteristic to provide a variable gradient effect in successive measurement cycles so as to provide for scanning of different regions of the excited layer in successive measurement cycles, (3) applying at a constant time $t_{\pi 1}$ after the 90° high frequency pulse a 180° high frequency pulse 180°-Hf-P and subjecting the layer to a field gradient $G_z$ with respect to said first axis z for a time interval $T_{z/2}$ where $T_z$ after the application of the 180° high frequency pulse which time interval is less than said 90° pulse time duration $T_z$, and (4) with the presence of a field gradient with respect to said second axis $G_x$ during a further time duration $T_x$, measuring the resulting nuclear spin echo having a symmetry center at a fixed time $t_{E1}$;

said mensuration being effected by repeating steps one through four above to effect successive measurement cycles, and by varying the timing of the third field gradient $G_y$ in relation to the constant time $t_{\pi 1}$ in successive measurement cycles so as to vary the difference between the third field gradient effect $\int G_y(t) \, dt$ before and after said 180° high frequency pulse in increments of a size $T_x G_x \cdot 1/N$ proportionate to the product of the second field gradient $G_x$, the further time duration $T_x$ and the reciprocal 1/N of the number of said measurement cycles.

2. Method according to claim 1, characterized in that finite rise- and build-up-times of the gradient fields are taken into consideration, said method comprising supplying driving pulses to gradient field coils to produce the second and third field gradients, and adding to the duration of the driving pulses in such a manner that always the contribution of a first addition interval of a first duration before the 180° high frequency pulse is substantially compensated by the contribution of a second addition interval of a similar duration after the 180° high frequency pulse, such first duration of the driving pulses taking account of the influence of the finite rise times of the driving pulses, and each first addition interval being selected to be of sufficient magnitude so that the associated gradient field attains its stationary value substantially within such addition interval.

3. Method according to claim 1, characterized in that, through the pulse train, two nuclear spin echoes are generated and the total measuring time for a complete image is abbreviated in that the second echo is generated by means of a second 180° high frequency pulse which is disposed centrally between the further field gradient of step four and an additional field gradient, so that, in the center of the additional field gradient at a constant time, a second echo can be evaluated which, regarding its information content, precisely corresponds to the negative gradient effect compared with the first echo.

4. Method according to claim 3, characterized in that additional nuclear spin echoes are generated in that additional 180° high frequency pulses successively following the first and second 180° high frequency pulses supplement the pulse train in each measurement cycle whereby all odd-numbered echoes contain the same data for the local resolution and all even-numbered echoes likewise contain the same data therefor, and that, before the reconstruction Fourier transformations, first the measured values of all odd-numbered echoes are summed up and correspondingly the measured values of all even-numbered echoes are likewise summed up, so that a nuclear spin image value is thus obtained which emphasizes the material components with long transverse relaxation times.

5. Method according to claim 4, characterized in that, before the summing-up differences on quotients between early and late echoes are formed, and images of the transverse relaxation time are calculated therefrom.

6. A method according to claim 1, characterized in applying a further 180° high frequency pulse while at least one field gradient is present, and applying such 180° high frequency pulse with sufficient spectral width and intensity to generate a further nuclear spin echo for the same layer region already scanned according to step four.

7. A method according to claim 6 characterized in that the 90° high frequency pulse serves to excite a layer generally longitudinally disposed relative to a patient.

8. A nuclear spin tomography method comprising effecting a mensuration of two-dimensional Fourier components of a desired nuclear sprin property in a selected layer with the use of gradient fields disposed in mutually orthogonal directions, and effecting an image reconstruction with respect to the desired nuclear spin property in said layer, characterized in that, employing an optimally brief pulse train, said mensuration is effected by the steps comprising:
  (1) applying in conjunction with a layer selection field gradient $G_z$ with respect to an axis z intersecting the layer, a shaped 90° high frequency pulse 90°-Hf-P to excite a layer with a given location with respect to the axis z=const for a 90° pulse time duration $T_z$,
  (2) following termination of the 90° high frequency pulse of said 90° pulse time duration $T_z$, applying an orthogonal field gradient $G_\phi$ orthogonal to said axis and at a variable angle of rotation in successive measurement cycles so as to provide for scanning of different regions of the excited layer in successive measurement cycles,
  (3) applying at a constant time $t_{\pi 1}$ after the 90° high frequency pulse a 180° high frequency pulse 180°-Hf-P and subjecting the layer to a field gradient $G_z$ with respect to said axis z for a time interval $T_{z/2}$ after the application of the 180° high frequency pulse which time interval is less than said 90° pulse time duration $T_z$, and
  (4) with the presence of an orthogonal field gradient $G_\phi$ orthogonal to said axis during a further time duration $T_x$, measuring the resulting nuclear spin echo having a symmetry center at a fixed time $t_{E1}$; said mensuration being effected by repeating steps one through four above to effect successive measurement cycles, and by varying the rotational angle of the orthogonal field gradient in successive measurement cycles.

9. A method according to claim 8 with the gradient fields being produced by supplying driving pulses of only one polarity during the pulse train effecting said mensuration.

10. A method according to claim 8, characterized in that where N measuring points are resolved for each rotational angle of the orthogonal gradient field, the mensuration is effected in approximately one and one-half times N measurement cycles.

11. A method according to claim 8 with the orthogonal gradient fields being produced by driving pulses to the duration of which are added first and second addition intervals of constant first and second duration so that for each measurement cycle the contribution of the first addition interval of the first duration before the 180° high frequency pulse is compensated by the contribution of the second addition interval of the second duration after the 180° high frequency pulse, with the inclusion of the influence of the finite rise times, the first addition interval being selected to be of sufficient magnitude so that the gradient field has attained its stationary value substantially within said first duration.

12. Method according to the claim 8, characterized in that additional nuclear spin echoes are generated in order to improve the signal-to-noise ratio through mean value formation, in that additional 180° high frequency pulses supplement the pulse train for each measurement cycle, and all generated echoes contain the same information for the local resolution.

13. Method according to claim 12, characterized in that, in the case of sufficiently intense-in the sense of adequate spectral width -short 180° high frequency pulses, during the first and the following 180° high frequency pulses, the orthogonal field gradient remains continuously present and is separated only by the 180° high frequency pulses into pre- and post-phase segments.

14. A method according to claim 8 characterized in that the 90° high frequency pulse serves to excite a layer generally longitudinally disposed relative to a patient.

15. Method according to claim 1, characterized in that, by means of selective 90° high frequency pulses, several parallel planes of the specimen to be examined are simultaneously excited, and the superimposed signals are read out, whereby, through a suitable excitation sequence in a sequence of several measuring cycles it is guaranteed that the obtained measured values can be computationally again associated with the individual planes.

16. A method according to claim 6, with the second field gradient being present continuously at least from a time prior to the measuring of the resulting nuclear spin echo with the symmetry center at said fixed time through to completion of the generation of said further nuclear spin echo.

17. A method according to claim 1, with said second field gradient being continuously present from a time prior to said 180° high frequency pulse to a time subsequent to said 180° high frequency pulse, the difference in the time duration of the second field gradient before and after said 180° high frequency pulse being varied in successive measurement cycles to provide for scanning of different regions of the excited layer, and said 180° high frequency pulse having sufficient spectral width and intensity to effect scanning over the selected layer.

18. A nuclear spin tomography method comprising effecting a mensuration of all two-dimensional Fourier components of a desired nuclear spin property in a selected layer with the use of three gradient fields disposed in three mutually orthogonal directions, and effecting an image reconstruction with respect to the desired nuclear spin property in said layer, characterized in that said mensuration is effected by the steps comprising:
  (1) applying in conjunction with a first field gradient with respect to a first axis a 90° high frequency pulse to excite a layer with a given location with respect to the first axis for a 90° pulse time duration,
  (2) following termination of the 90° high frequency pulse of said 90° pulse time duration, applying orthogonally related second and third field gradients with respect to second and third axes, the second field gradient having a timing related to the scanning of the layer relative to said second axis, and the third field gradient having a variable timing characteristic to provide a variable gradient effect in successive measurement cycles so as to provide for scanning of different regions of the excited layer in successive measurement cycles, (3) applying at a constant time after the 90° high frequency pulse a 180° high frequency pulse, and (4) with the presence of a field gradient with respect to said second axis during a further time duration measuring the resulting nuclear spin echo having a symmetry center at a fixed time;

said mensuration being effected by repeating steps one through four above to effect successive measurement cycles, and by varying the timing of the third field gradient in relation to the constant time in successive measurement cycles so as to vary the difference between the third field gradient effect before and after said 180° high frequency pulse.

* * * * *